United States Patent
Sekiya

(10) Patent No.: US 7,705,430 B2
(45) Date of Patent: *Apr. 27, 2010

(54) SEMICONDUCTOR WAFER AND PROCESSING METHOD FOR SAME

(75) Inventor: Kazuma Sekiya, Tokyo (JP)

(73) Assignee: Disco Corporation, Tokyo (JP)

( * ) Notice: Subject to any disclaimer, the term of this patent is extended or adjusted under 35 U.S.C. 154(b) by 712 days.

This patent is subject to a terminal disclaimer.

(21) Appl. No.: 11/408,971

(22) Filed: Apr. 24, 2006

(65) Prior Publication Data

US 2006/0244096 A1 Nov. 2, 2006

(30) Foreign Application Priority Data

Apr. 27, 2005 (JP) ............................. 2005-129741
Jun. 6, 2005 (JP) ............................. 2005-165395

(51) Int. Cl.
*H01L 21/544* (2006.01)

(52) U.S. Cl. ............................. 257/619; 257/E23.179; 438/690; 438/689; 438/464

(58) Field of Classification Search ................. 438/464, 438/690, 689, 692, 458, 459, 460; 257/619, 257/E23.179
See application file for complete search history.

(56) References Cited

U.S. PATENT DOCUMENTS

| 6,852,608 B2 * | 2/2005 | Kitamura et al. ............ 438/464 |
| 2003/0215985 A1 * | 11/2003 | Kouno et al. ................ 438/135 |

* cited by examiner

*Primary Examiner*—Fernando L Toledo
*Assistant Examiner*—Mamadou Diallo
(74) *Attorney, Agent, or Firm*—Smith, Gambrell & Russell, LLP

(57) ABSTRACT

A semiconductor wafer which is generally circular, and which has on its face an annular surplus region present in an outer peripheral edge portion of the face, and a circular device region surrounded by the surplus region, the device region having many semiconductor devices disposed therein. A circular concavity is formed in the back of the semiconductor wafer in correspondence with the device region, and the device region is relatively thin, while the surplus region is relatively thick.

1 Claim, 4 Drawing Sheets

SEMICONDUCTOR WAFER AND PROCESSING METHOD FOR SAME

FIELD OF THE INVENTION

This invention relates to a semiconductor wafer which is generally circular, and which has on the face thereof a surplus region present in an outer peripheral edge portion of the face, and a circular device region surrounded by the surplus region, the device region having many semiconductor devices disposed therein; and a processing method for such a semiconductor wafer.

DESCRIPTION OF THE PRIOR ART

As is well known among people skilled in the art, it is common practice in the manufacture of a semiconductor device to dispose many semiconductor devices on the face of a generally circular semiconductor wafer, then grind the back of the semiconductor device to decrease the thickness of the semiconductor device to a required value, then, if necessary, conduct a required test, such as a probe test, on each of the semiconductor devices, and then dice the semiconductor wafer to separate the semiconductor devices individually.

In recent times, it is often desired to grind the back of the semiconductor wafer, thereby rendering the thickness of the semiconductor wafer markedly small, for example, 50 μm or smaller, for the purpose of downsizing and weight reduction of the semiconductor device. However, if the thickness of the semiconductor wafer is rendered very small, the rigidity of the semiconductor wafer is markedly low. Thus, the semiconductor wafer is difficult to handle, and the risk of damage to the semiconductor wafer is also incurred.

SUMMARY OF THE INVENTION

It is a first object of the present invention, therefore, to provide a novel and improved semiconductor wafer which can avoid difficulty in handling the semiconductor wafer and can minimize the risk of damaging the semiconductor wafer, while fulfilling the requirements for downsizing and weight reduction of semiconductor devices.

It is a second object of the present invention to provide a novel and improved processing method for a semiconductor wafer which is designed to form the above novel and improved semiconductor wafer.

The inventor conducted in-depth studies, and has noticed that on the face of a semiconductor wafer, there are a surplus region present in an outer peripheral edge portion of the face, and a circular device region surrounded by the surplus region, and many semiconductor devices are disposed in the device region. Based on these facts, the inventor has found that the above first and second objects can be attained by forming a circular concavity in the back of the semiconductor wafer in correspondence with the device region to decrease the thickness of the device region of the semiconductor wafer to a required value, but render the thickness of the surplus region of the semiconductor wafer relatively large, instead of grinding the entire back of the semiconductor wafer to decrease the entire thickness of the semiconductor wafer.

According to the present invention, there is provided, as a semiconductor wafer for attaining the above first object, a semiconductor wafer which is generally circular, and which has on the face thereof an annular surplus region present in an outer peripheral edge portion of the face, and a circular device region surrounded by the surplus region, the device region having many semiconductor devices disposed therein, and wherein a circular concavity is formed in the back of the semiconductor wafer in correspondence with the device region, and the device region is relatively thin, while the surplus region is relatively thick.

The width of the surplus region is preferably 2.0 to 3.0 mm. Preferably, the thickness of the surplus region is 250 μm or more, particularly 300 to 700 μm, while the thickness of the device region is 100 μm or less, particularly 30 to 50 μm.

According to the present invention, moreover, there is provided, as a processing method for a semiconductor wafer for attaining the above second object, a processing method for a semiconductor wafer which is generally circular, and which has on the face thereof an annular surplus region present in an outer peripheral edge portion of the face, and a circular device region surrounded by the surplus region, the device region having many semiconductor devices disposed therein, the processing method comprising forming a circular concavity in the back of the semiconductor wafer in correspondence with the device region to decrease the thickness of the device region.

Preferably, the circular concavity is formed by grinding the back of the semiconductor wafer. Particularly, it is preferred to form the circular concavity by grinding the back of the semiconductor wafer by means of a grinding tool having a plurality of arcuate grinding members arranged in a generally toroidal form, or a toroidal grinding member, the grinding members or the grinding member having an outer diameter somewhat larger than the radius of the circular concavity. When grinding the back of the semiconductor wafer by means of the grinding tool, it is preferred to position the grinding tool relative to the semiconductor wafer such that the outer peripheral edge of the grinding members or the grinding member is inscribed in the outer peripheral edge of the device region, and the lower surface of the grinding members or the grinding member straddles the center of the semiconductor wafer, to rotate the semiconductor wafer about the central axis of the semiconductor wafer, to rotate the grinding tool about the central axis of the grinding members or the grinding member, and to move the grinding tool toward the semiconductor wafer in the direction of the central axis. After the circular concavity is formed, the semiconductor wafer is cut along the outer peripheral edge of the device region to remove the surplus region, and then the device region is diced, whereby the semiconductor devices can be separated individually. Alternatively, a circular auxiliary member corresponding to the circular concavity is accommodated in the circular concavity, and then the surplus region is diced along with the device region, whereby the semiconductor devices can be separated individually.

DETAILED DESCRIPTION OF THE PREFERRED EMBODIMENTS

Figure 1:
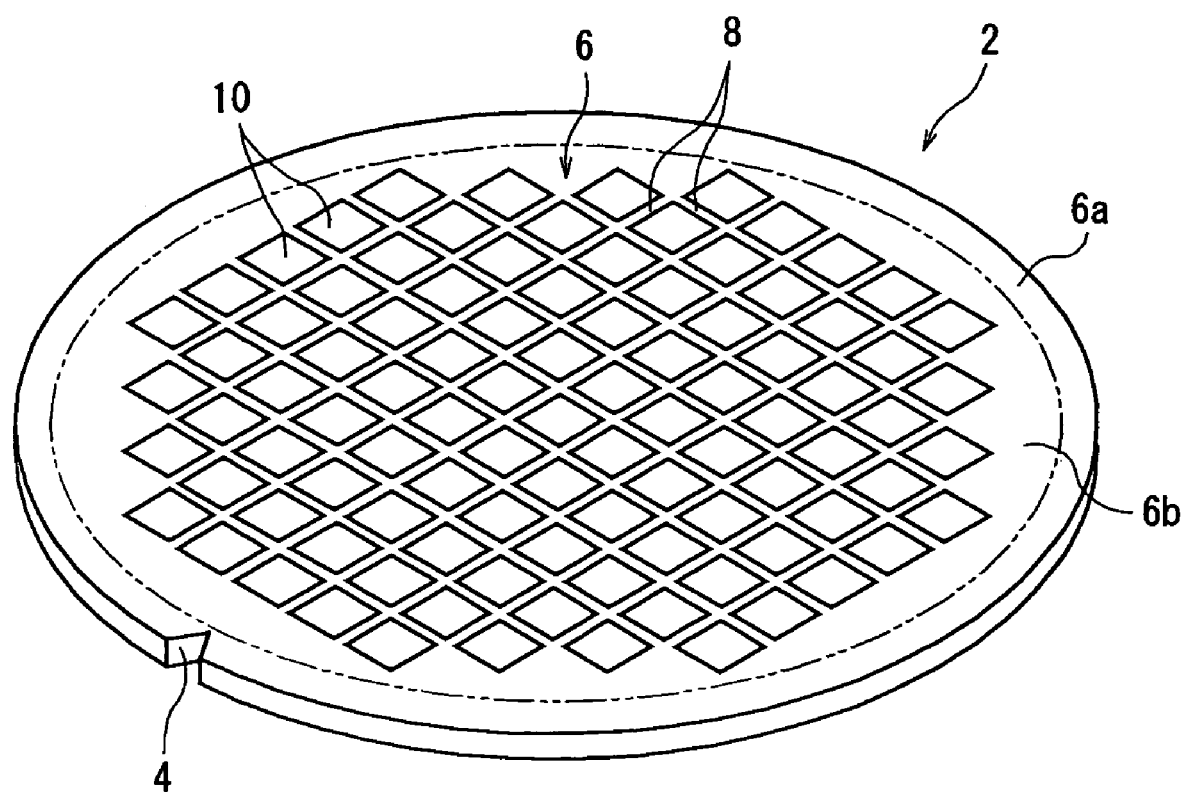
FIG. 1 is a perspective view showing a semiconductor wafer before being processed according to the present invention.

FIG. 1 shows a typical example of a semiconductor wafer 2 well known per se before being processed which is subjected to processing (to be described later) to configure a semiconductor wafer according to the present invention. The illustrated wafer 2 is circular as a whole, and has an orientation notch 4 formed in a circumferential edge portion thereof. The thickness of the wafer 2 is uniform throughout, and is preferably 250 µm or more, especially 300 to 700 µm. On the face 6 of the wafer 2 there are an annular surplus region 6a present in an outer peripheral edge portion of the face 6, and a circular device region 6b surrounded with the surplus region 6a. The notch 4 is formed in the annular surplus region 6a. The circular device region 6b has many rectangular regions 10 partitioned by streets 8 arranged in a lattice pattern, and a semiconductor device is disposed in each of the rectangular regions 10.

Figure 2:
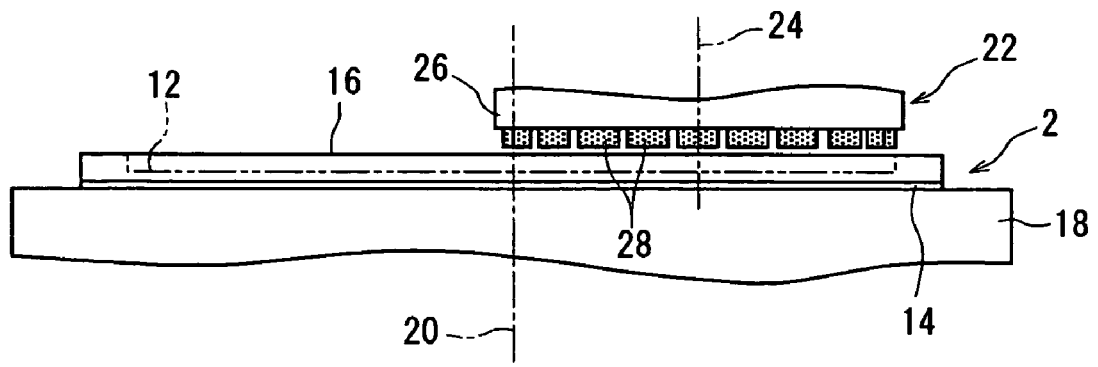
FIG. 2 is a schematic sectional view showing a manner in which the back of the wafer in FIG. 1 is ground to form a circular concavity.

In the present invention, a circular concavity 12 (FIG. 4) is formed in the back of the wafer 2 in correspondence with the circular device region 6b. With reference to FIG. 2 showing a preferred method for forming the circular concavity 12, a protective tape 14, which may be a suitable plastic film, is stuck to the face of the wafer 2. Such a wafer 2 is placed on a substantially horizontal upper surface of a chuck table 18, with the wafer 2 being turned upside down, namely, the back 16 of the wafer 2 being exposed upward. The chuck table 18 is mounted to be rotatable about a central axis 20 extending vertically, and is rotated by a rotational drive source (not shown). The chuck table 18 is formed of a porous material, or a suction hole or groove (not shown) is formed in the surface of the chuck table 18, so that the wafer 2 is attracted under vacuum onto the chuck table 18 by connecting the chuck table 18 to a suitable suction source (not shown).

A grinding tool 22 is caused to act on the back 16 of the wafer 2 attracted onto the chuck table 18 to form the circular concavity 12 in the back 16 of the wafer 2. The grinding tool 22 is mounted to be rotatable about a central axis 24 extending vertically, and is rotated at a high speed by a rotational drive source (not shown). The illustrated grinding tool 22 includes a support member 26 having a cylindrical lower end portion, and a plurality of grinding members 28 fixed to the lower end surface of the support member 26. The grinding members 28, which can be formed from diamond grains bonded together by a suitable bonding material, are each arcuate, and arranged with spacing in the circumferential direction to assume a toroidal form as a whole. Instead of the plural grinding members 28 each of an arcuate shape, a single toroidal grinding member (not shown) can be fixed to the lower surface of the support member 26.

Figure 3:
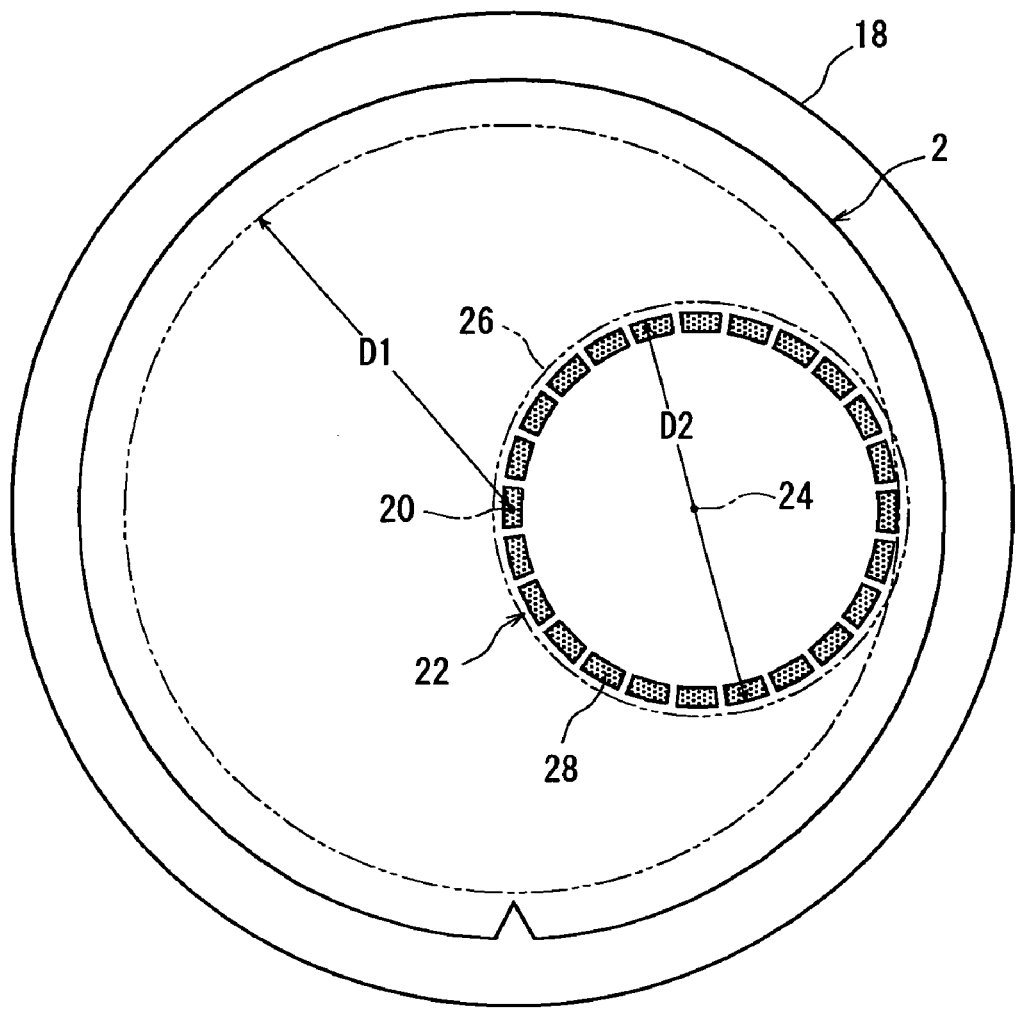
FIG. 3 is a schematic plan view showing the relationship between the wafer and grinding members of a grinding tool when the back of the wafer 2 is ground in the manner shown in FIG. 2.
Figure 4:
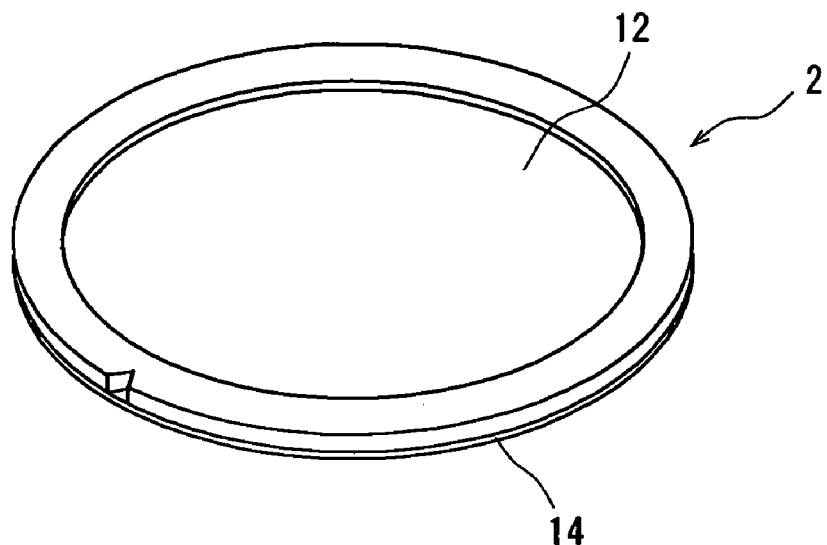
FIG. 4 is a perspective view showing a preferred embodiment of the wafer of the present invention having the circular concavity formed in the back of the wafer.

In a preferred processing method according to the present invention, there is used the grinding tool 22 in which the outer diameter D2 of the grinding members 28 is somewhat larger than the radius D1 of the circular concavity 12 to be formed. As shown in FIGS. 2 and 3, the grinding tool 22 is positioned relative to the wafer 2 such that the outer peripheral edge of the grinding members 28 is inscribed in the outer peripheral edge of the device region 6b (accordingly, the inner peripheral edge of the circular concavity 12 to be formed), and the grinding member 28 straddles the central axis 20 of the wafer 2. In this state, the chuck table 18 is rotated about the central axis 20, the grinding tool 22 is rotated about the central axis 24, and the grinding tool 22 is gradually moved, namely, lowered toward the wafer 2. In this manner, the back 16 of the wafer 2 is ground in correspondence with the device region 6b to form the circular concavity 12. The thickness of the wafer 2 in the device region 6b after formation of the circular concavity 12 is preferably 100 µm or less, especially 30 to 50 µm. FIG. 4 shows the wafer 2 having the circular concavity 12 formed in the back 16, with the wafer being turned upside down. In the wafer 2 shown in FIG. 4, the device region 6b is markedly thin, whereas the annular surplus region 6a surrounding the device region 6b is relatively thick, so that the wafer 2 as a whole has adequate rigidity.

If desired, it is possible to form the circular concavity 12 in the back 16 of the wafer 2 by plasma etching, sputter etching, or chemical-mechanical-polishing, instead of forming the circular concavity 12 in the back 16 of the wafer 2 by grinding.

The wafer 2 having the circular concavity 12 formed therein can, if desired, be further subjected to suitable processing. For example, a thin film comprising a metal, such as gold, silver or titanium, can be formed on the back 16 of the wafer 2 by a sputtering method well known per se. Moreover, the protective tape 14 stuck to the face 6 of the wafer 2 can be peeled from the wafer 2 to expose the face 6, and a probe test well known per se can be conducted on the semiconductor device disposed in each of the rectangular regions 10. In applying required processing to the wafer 2, an operation, such as transport of the wafer 2, can be performed sufficiently easily, and the risk of damage to the wafer 2 can be fully avoided, because the rigidity of the wafer 2 is relatively great owing the presence of the annular surplus region 6a having a relatively large thickness.

After the required processing is performed for the wafer 2, the wafer 2 is diced, namely, the wafer 2 is cut along the streets 8 arranged in a lattice pattern in the device region 6b on the face 6, to separate the rectangular regions 10 individually.

Figure 5:
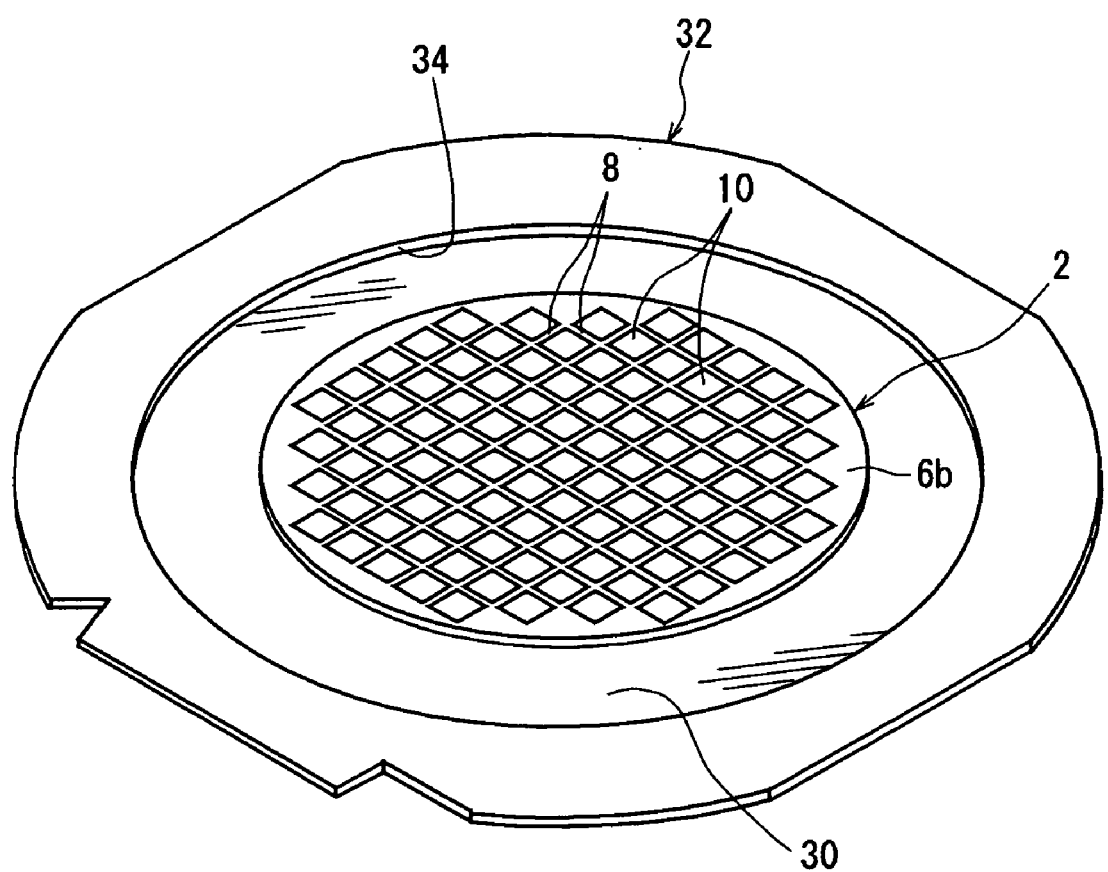
FIG. 5 is a perspective view for illustrating a mode of dicing the wafer of FIG. 4.

In one mode of dicing the wafer 2, the wafer 2 is first cut along the outer peripheral edge of the device region 6b to remove the annular surplus region 6a. Such cutting of the wafer 2 can be advantageously performed, for example, by irradiating the wafer 2 with a pulsed laser beam along the outer peripheral edge of the device region 6b. Then, as shown in FIG. 5, the wafer 2 is mounted on a frame 32 via a mounting tape 30. In further detail, the frame 32, which can be formed from a plate of a metal, such as aluminum, or a suitable synthetic resin, has a mounting opening 34 in its middle portion. The wafer 2 deprived of the annular surplus region 6a is positioned in the mounting opening 34, and the mounting tape 30 is stuck to the back of the frame 32 and the back 16 of the wafer 2, whereby the wafer 2 is mounted on the frame 32. The wafer 2 mounted on the frame 32 can be diced, namely, cut along the streets 8 in the device region 6b, by a well known cutting machine called a dicer. Preferred examples of the dicer are those having an ultrathin ring-shaped blade containing diamond grains as a cutting means, or those having a pulsed laser beam application means as a cutting means.

Figure 6:
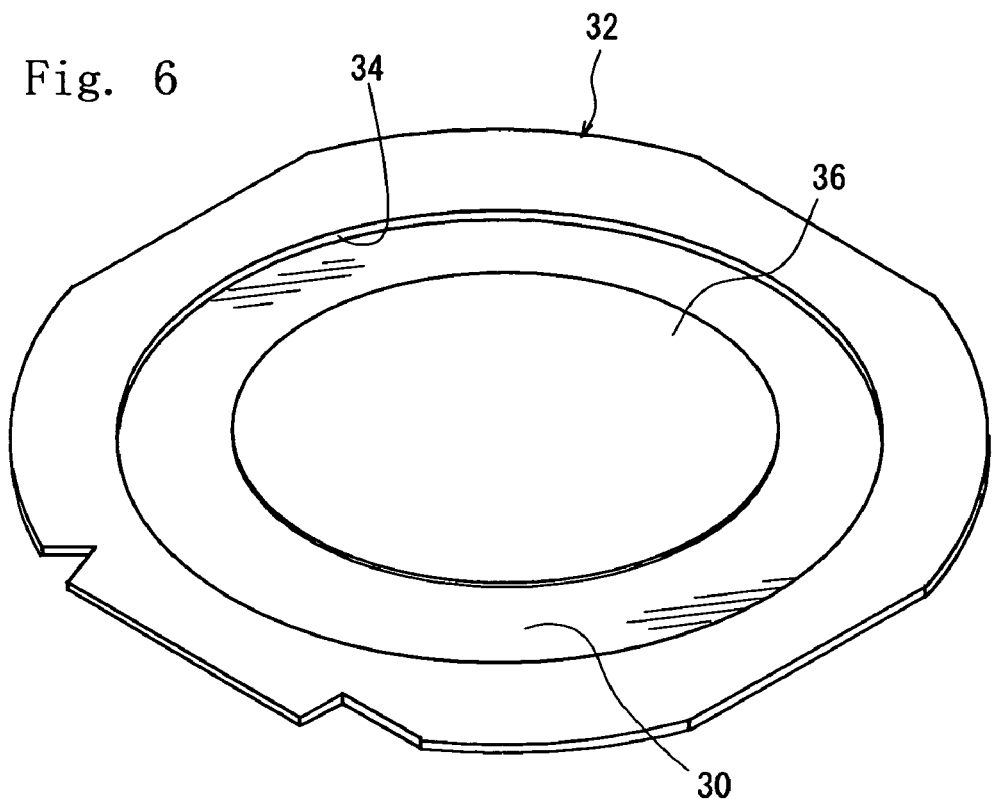
FIG. 6 is a perspective view for illustrating the way of using an auxiliary member for use in a different mode of dicing the wafer of FIG. 4.
Figure 7:
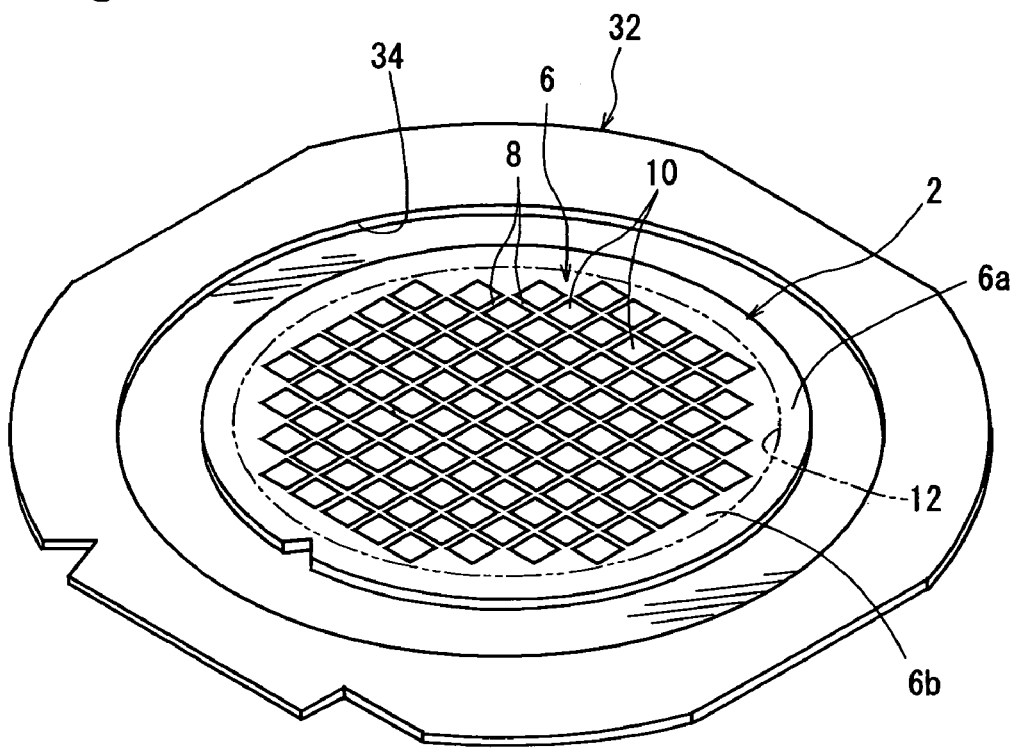
FIG. 7 is a perspective view for illustrating the above different mode of dicing the wafer of FIG. 4.

Another mode of dicing the wafer 2 is to mount an auxiliary member 36 in the middle portion of the mounting opening 34 of the frame 32 via the mounting tape 30, before mounting the wafer 2 on the frame 32, as shown in FIG. 6. In other words, the auxiliary member 36 is positioned in the mounting opening 34 of the frame 32, and the mounting tape 30 is stuck to the back of the frame 32 and the back of the auxiliary member 36. The auxiliary member 36, which can be formed from a suitable synthetic resin or a suitable metal, is a disk having a shape corresponding to the circular concavity 12 formed in the back 16 of the wafer 2, namely, a circular plane shape corresponding to the circular concavity 12, and a thickness corresponding to the depth of the circular concavity 12. Then, as shown in FIG. 7, the wafer 2 is positioned such that the auxiliary member 36 is accommodated in the circular concavity 12 formed in the back 16, whereafter the back of the annular surplus region 6a of the wafer 2 is stuck to the mounting tape 30. In this manner, the wafer 2 is mounted in the mounting opening 34 of the frame 32. The wafer 2 and the auxiliary member 36, which have been mounted in the frame 32, complement each other to constitute a disk having a uniform thickness as a whole. Then, the wafer 2 is diced, namely, cut along the streets 8 in the device region 6b, by a well known cutting machine.

While the preferred embodiments of the present invention have been described in detail by reference to the accompanying drawings, it is to be understood that the invention is not limited to such embodiments, but various changes and modifications may be made without departing from the scope of the invention.

What is claimed is:

1. A semiconductor wafer which is generally circular, and which has on a face thereof an annular surplus region present in an outer peripheral edge portion of the face, and a circular device region surrounded by the surplus region, the device region having many semiconductor devices disposed therein, wherein a circular concavity is formed in a back of the semiconductor wafer in correspondence with the device region, a width of the surplus region is 2.0 to 3.0 mm, the thickness of the device region is 30 to 50 μm, and the thickness of the surplus region is 300 to 700 μm.

\* \* \* \* \*